US009329203B1

(12) United States Patent
Ptasinski et al.

(10) Patent No.: US 9,329,203 B1
(45) Date of Patent: May 3, 2016

(54) ULTRA-SHARP NANOPROBES AND METHODS

(71) Applicants: Joanna Ptasinski, La Jolla, CA (US); Stephen D. Russell, San Diego, CA (US)

(72) Inventors: Joanna Ptasinski, La Jolla, CA (US); Stephen D. Russell, San Diego, CA (US)

(73) Assignee: The United States of America, as Represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 14/697,129

(22) Filed: Apr. 27, 2015

(51) Int. Cl.
*G01Q 60/38* (2010.01)
*B82Y 15/00* (2011.01)

(52) U.S. Cl.
CPC *G01Q 60/38* (2013.01); *B82Y 15/00* (2013.01)

(58) Field of Classification Search
CPC .................................. G01Q 60/38; B82Y 15/00
See application file for complete search history.

(56) References Cited

U.S. PATENT DOCUMENTS

2007/0211986 A1* 9/2007 Niwa ............... B82Y 20/00 385/13
2008/0011066 A1* 1/2008 Suh ................ B82Y 15/00 73/105
2008/0016953 A1* 1/2008 Suh ................ B82Y 35/00 73/105

OTHER PUBLICATIONS

Kwon, S.J., et al., "Fabrication of high-aspect-ratio silicon nanostructures using near-field scanning optical lithography and silicon anisotropic wet-etching process" Appl. Phys. A 86, 11-18 (2007).*
D.P. Burt et al., "A Simple Method for High Yield Fabrication of Sharp Silicon Tips," Microelectronic Engineering vol. 85, pp. 625-630, United Kingdom (2008).
Choi, Chang-Hwan, "3-D Nanopatterning and Nanofabrication: Using Nano-Scalloping Effects in Bosch Deep Reactive Ion Etching," AzoNano.com, http://www.azonano.com/article.aspx?ArticleID=2714, Oct. 10, 2010.
Tseng, Ching-Li et al., "Fabrication and Characterization of Well-Aligned and Ultra-Sharp Silicon Nanotip Array," Nanoscale Research Letters 7:120, http://www.nanoscalereslett.com/content/7/1/120, (2012).
Kang, C.K. et al., "The Fabrication of Patternable Silicon Nanotips Using Deep Reactive Ion Etching," J. Micromech. Microeng. 18, 075007 (7pp), (2008).

* cited by examiner

*Primary Examiner* — Wyatt Stoffa
(74) *Attorney, Agent, or Firm* — SSC Pacific Patent Office; Arthur K. Samora; Kyle Eppele

(57) ABSTRACT

Methods for fabricating ultra-sharp nanoprobes can include the steps of providing a wafer, and patterning a silicon layer on the wafer with a plurality of geometric structures. The geometric structures can be patterned using electron-beam lithography or photolithography, and can have circular, triangular or other geometric shapes when viewed in top plan. The methods can further include the step of depositing a non-uniform cladding on the geometric structures using plasma enhanced chemical vapor deposition (PECVD) techniques, and then wet-etching the wafer. The non-uniform nature of the cladding can result in more complete etching in the areas where the cladding has lower density and incomplete etching in the areas of higher density of the non-uniform cladding. The different etching rates in the proximity of at least adjacent two geometric structures can result in the formation of ultra-sharp nanoprobes.

18 Claims, 5 Drawing Sheets

ULTRA-SHARP NANOPROBES AND METHODS

FEDERALLY-SPONSORED RESEARCH AND DEVELOPMENT

This invention (Navy Case No. 103009) is assigned to the United States Government and is available for licensing for commercial purposes. Licensing and technical inquires may be directed to the Office of Research and Technical Applications, Space and Naval Warfare Systems Center, Pacific, Code 72120, San Diego, Calif. 92152; voice (619) 553-5118; email ssc_pac_T2@navy.mil.

FIELD OF THE INVENTION

The present invention pertains generally to nanoprobes. More specifically, the invention pertains to ultra-sharp nanoprobes and methods for fabricating ultra-sharp nanoprobes of any desired shape, which can allow for more precise chip-scale placement of the nanoprobe for microelectronic and nanophotonic applications.

BACKGROUND OF THE INVENTION

Ultra-sharp nanoprobes can offer many applications in the areas of high-efficiency field emission flat panel displays, biochemistry (biochemical sensing), biomimetics, electronics, atomic/scanning probe microscopy, scanning tunneling microscopy, nanolithography, optics, and nanoimprinting. The most important nanoprobes parameters for some of the above-cited applications can include the apex size, the probe location and the probe shape. Nanoprobes can be fabricated from a multitude of materials including silicon, silica, metal, polymer, and carbon nanotube. For atomic force microscopy (AFM) applications, the radius of curvature of the probe end is the point of contact between the probe and the sample, and the radius of curvature can be responsible for the lateral distortion that is seen in the resulting AFM images. In order to get clearer, more accurate pictures, the AFM probe radius should be as small as possible. Also, the probe's access to the depths of the sample and the microscope depth of field can be determined and can be limited by the shape of the probe's body.

Nanoprobe fabrication is fast becoming an attractive research field in nanoengineering. Many groups are trying to find ways of minimizing the probe radius, and many groups are also exploring methods of engineering the shape of the nanoprobe body. The current state of the art in nanoprobes fabrication can often rely on techniques that utilize elaborate precursor chemicals, catalysts, vacuum conditions, or equipment, and any combination thereof. To realize their ultimate potential, synthesized nanoprobes may require simpler fabrication techniques that can allow for control over the final nanomorphology of the nanoprobe.

One such nanoprobe fabrication technique can be the Bosch process, which alternates repeatedly between two modes to achieve nearly vertical structures. The first mode can be a standard, nearly isotropic plasma etch. The plasma contains some ions, which attack the wafer from a nearly vertical direction. Sulfur hexaflouride $SF_6$ is often used for silicon. The second mode can be deposition of a chemically inert passivation layer. For instance, $C_4F_8$ source gas can yield a substance similar to a Teflon® material. Each mode can last for several seconds. The passivation layer can protect the entire substrate from further chemical attack and prevents further etching. However, during the etching phase, the directional ions that bombard and etch the substrate also attack the passivation layer at the bottom of the trench (but not along the sides). The directional ions can collide with the passivation layer and can sputter portions of the passivation layer off, which can expose the substrate to the chemical etchant. Further, these etch/deposit steps are repeated many times over, which can result in a large number of very small isotropic etch steps taking place only at the bottom of the etched pits.

The Bosch process described above can be time consuming and it can result in spiral shaped nanoprobes. Other alternative fabrication methods can include plasma etching with $Cl_2$/HBr or anisotropic wet etching with KOH. The $Cl_2$/HBr etch method can require nanoscale patterning using electron beam lithography prior to the etching process, which can be time consuming and expensive. Also, the delicate processing care required for these methods can result in low production yield. Anisotropic wet etching is a relatively simple fabrication method, but this method can typically result in pyramidal shape structures, which are not tall, and which lack very sharp ends. Thus, this method of etching can result in nanoprobes with limited effectiveness.

In view of the above, it can be an object of the present invention to provide a method for manufacturing ultra-sharp nanoprobes which can be used more effectively for AFM applications. Another object of the present invention can be to provide a method for manufacturing ultra-sharp nanoprobes, which can result in a relatively high yield of nanoprobes, when compared to the prior art. Still another object of the present invention is to provide a method for manufacturing ultra-sharp nanoprobes that uses low temperature deposition techniques to fabricate the nanoprobes. Another object of the present invention to provide a method for manufacturing ultra-sharp nanoprobes that take advantage of non-uniform cladding "defects" to fabricate the nanoprobe. Yet another object of the present invention is to provide a method for manufacturing ultra-sharp nanoprobes which is easy to manufacture, that is inexpensive, and that is easy to use.

SUMMARY OF THE INVENTION

Methods for fabricating an ultra-sharp nanoprobes in accordance with several embodiments of the present invention can include the initial steps of providing a wafer, and patterning the wafer with a plurality of geometric structures. The geometric structures can made of materials selected from the group consisting of silicon, metals, GaAs, GaN, Sapphire, Germanium, InP, GaP, GaSb, InSb, InAs, CdS, CdTe, ZnO, ZnSe, $LiNbO_3$ and $LiTaO_3$, and can further have circular or triangular geometric shapes. Other shapes are possible. The geometric structures can be patterned using electron-beam lithography or photolithography.

Methods in accordance with several embodiments can further include the step of depositing a non-uniform cladding on the wafer and then wet-etching the wafer. Deposition of the non-uniform cladding can be accomplished using plasma enhanced chemical vapor deposition (PECVD) techniques. The PECVD can be accomplished using materials selected from the group consisting of $SiO_x$, $SiN_x$, $SiO_xN_y$. Amorphous silicon (a-Si:H), SiC, and Diamond-like carbon (DLC). The non-uniform nature of the cladding can result in more complete etching in the areas where the cladding has lower density and incomplete etching in the areas of higher density of the non-uniform cladding. At least two geometric structures can be shaped and arranged so that at least two geometric structures can cooperate with the cladding to form the ultra-sharp nanoprobes due to the different rates of etching of the non-uniform cladding. Nanoprobes having a radius of less than twenty nanometers can be realized.

BRIEF DESCRIPTION OF THE DRAWINGS

The novel features of the present invention will be best understood from the accompanying drawings, taken in conjunction with the accompanying description, in which similarly-referenced characters refer to similarly-referenced parts, and in which.

DETAILED DESCRIPTION OF THE EMBODIMENTS

This invention can exploit the properties of low density films deposited with plasma enhanced chemical vapor deposition (PECVD) in the fabrication of ultra-sharp nanoprobes. PECVD can be performed at lower deposition temperatures than CVD. The resulting PECVD oxides produced at lower temperatures (250° C.-350° C.) are typically significantly more porous than those deposited at higher temperatures such as those from normal CVD processes. This material nonuniformity is particularly noticeable when PECVD oxides are deposited around silicon strip structures. Typically for SiO2 materials, the hydrofluoric acid (HF) etch rate can correlate well with the resulting film density.

This non-uniform oxide cladding is typically thought of in the prior art as an impediment or defect, which can profoundly and negatively affect microelectronic and nanophotonic circuit performance. The present invention according to several embodiments can take advantage of this porous, non-uniform oxide "defect" to fabricate extremely small, ultra-sharp nanoprobes structures.

Using the fabrication process steps described more fully below can result in lower density PECVD deposited SiO2 films within 1 μm on each side of a silicon strip structure. These low density regions can etch faster when the regions are subject to an HF solution. Silicon strip structures of various shapes can be placed in close proximity, within 2 um of each other, allowing for sharp oxide tips to be formed when the PECVD oxide layer is etched. The tip shape can be controlled by designing appropriate gaps between the silicon structures and by designing circular silicon type structures of various radii of curvature (as depicted in the Figures). Other geometric structures could be used. The final probe radius can reach sizes as small as approximately ten nanometers (10 nm).

Figure 1:
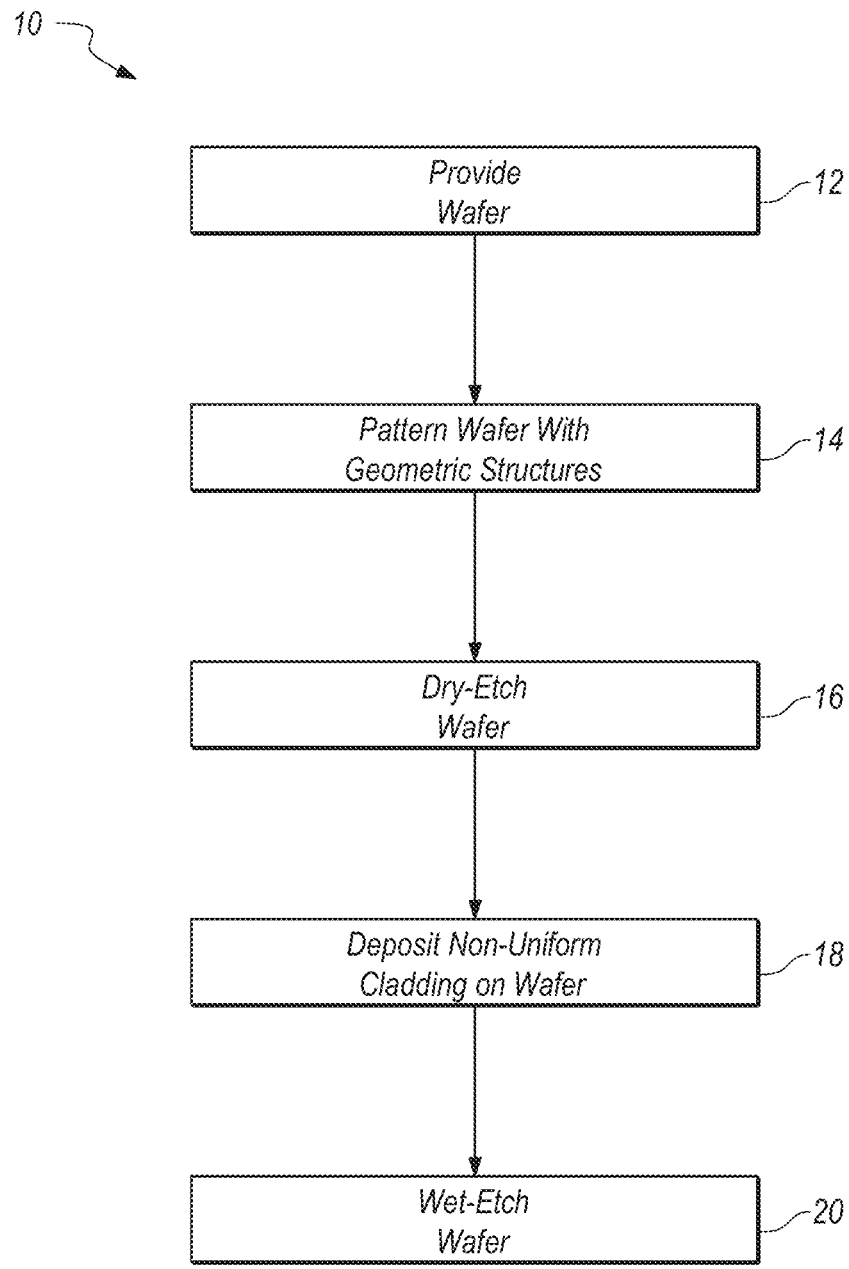
FIG. 1 is a block diagram of methods that can be taken to accomplish the methods of the present invention according to several embodiments.
Figure 2:
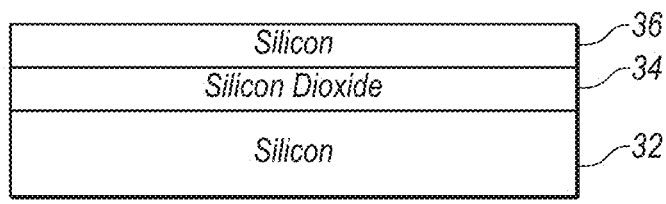
FIG. 2 is a greatly enlarged side elevational view of a silicon-on-insulator (SOI) wafer from the providing step in FIG. 1.

Referring initially to FIGS. 1 and 2, a block diagram, which shows steps that can be taken to accomplish the methods of the present invention according to several embodiments, can be shown and can be generally designated with reference character 10. As shown, method 10 can include the initial step 12 of providing a wafer 30. The wafer 30 can be a 680 μm thick silicon on insulator (SOI) wafer composed of a silicon layer 32, a 3 μm buried oxide (BOX) layer 34 and a 250 nm patterned silicon layer 36 can be placed on top of the BOX layer 36. A side elevational view of wafer 30 can be seen in FIG. 2. Other materials for layers 32, 34 and 36 could be used, depending of the desired applications selected by the end user.

Figure 6:
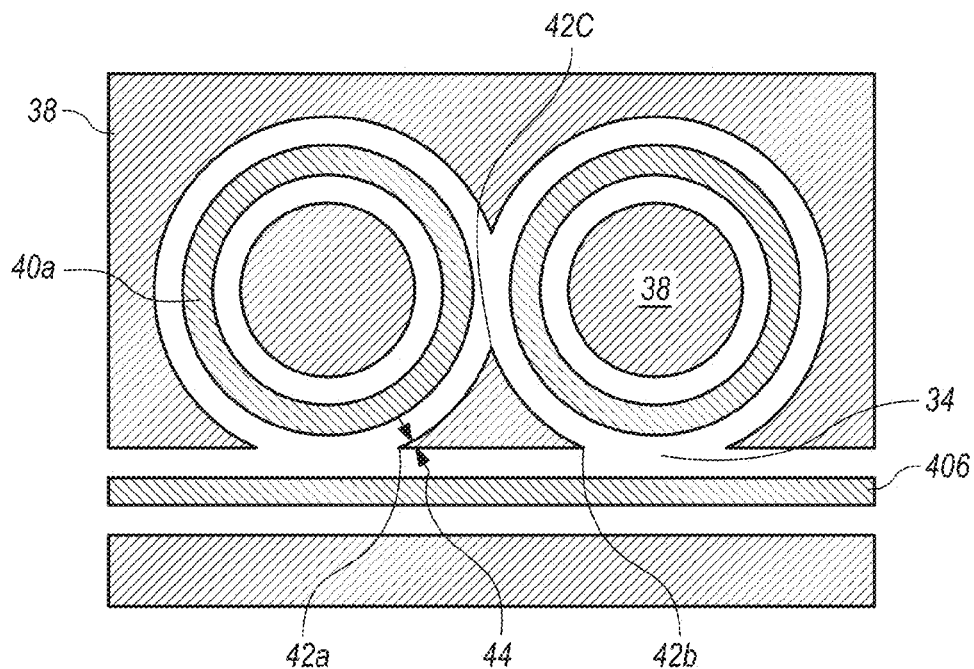
FIG. 6 is a top plan view of the wafer of FIG. 5.
Figures 7, 8:
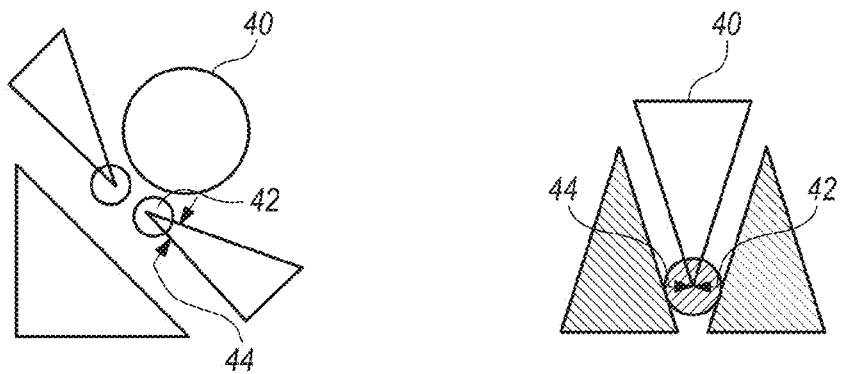
FIG. 7 is a top plan view of alternate geometries for the geometric structures of FIG. 6.
FIG. 8 is a top plan view of alternate geometries for the geometric structures of FIG. 6.

Referring again to FIG. 1, the methods according to several embodiments can include the step of patterning the wafer 30 with a plurality of geometric structures as indicated by box 14 of FIG. 1. As shown in FIGS. 6-8, the geometric structures 40 can be selected from the group consisting of lines, circles, squares, triangles, or any other complex polyhedral shape when viewed in top plan, so long as the geometric structures are arranged and spaced to form the nanoprobe once the methods of the embodiments are performed. A FOX-16 electron beam (e-beam) resist from Dow Corning® can be diluted in methyl isobutyl ketone (MIBK), one part FOX-16 to two parts MIBK (by weight), and spun at 4000 rpm, which can result in a 180 nm thick coat. A hot plate bake step at 175° C. for 4 minutes aids in removing the solvent. The patterning step can be accomplished in some of the embodiments with an e-beam lithography system, for instance a EBPG 5200 from VisTec®, using a dosage of 5,120 μC/cm$^2$, and developed in Tetramethylammonium hydroxide (TMAH) for 1 minute. Other patterning methods such as photolithography could also be used, depending on the material that is used for patterned silicon layer 36.

Figure 3:
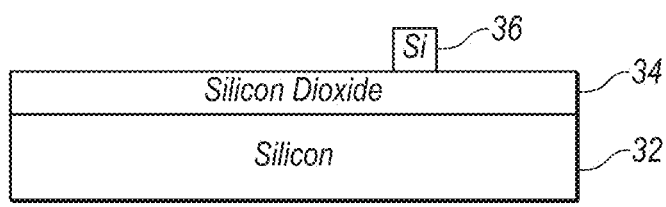
FIG. 3 is the same view as FIG. 2 after the dry-etching step.

After the wafer 30 is patterned, and as shown in FIGS. 1 and 3, the methods 10 can include the step of dry etching the patterned silicon layer 36 of wafer 30, as shown by block 16. In some embodiments, this can be accomplished using an Plasmalab® 100 reactive-ion etching/inductively coupled plasma (RIE/ICP) from Oxford Instruments Plasma Technology, Ltd, with a mixture of 25 standard cubic centimeters per minute (sccm) of sulfur hexafluoride ($SF_6$) and 50 sccm of Octafluorocyclobutane ($C_4F_8$) at a temperature of 15° C., and with a RIE power of 30 W and ICP power of 1200 W. As shown in FIG. 3, once the dry etching step occurs, all that remains is the portion of patterned silicon layer 36 that forms the aforementioned geometric structures.

Figure 4:
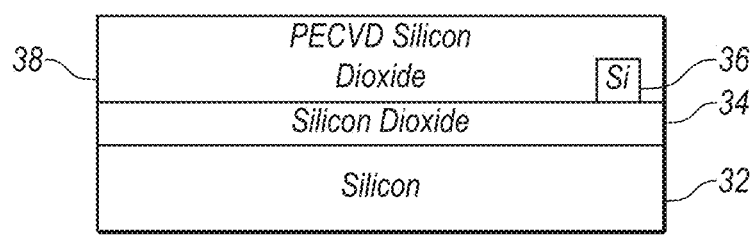
FIG. 4 is the same view as FIG. 2 after the depositing step.

Referring now to FIGS. 1 and 4, after wafer 30 has been dry-etched, a non-uniform cladding 38 (see FIG. 4) can be deposited over structures 40, as shown by step 18 in FIG. 1. Non-uniform cladding 38 can be a 1800 nm layer of SiO2 cladding deposited via any lower temperature method the can cause non-uniformity, such as plasma-enhanced chemical vapor deposition (PECVD), for example (250° C.-350° C.). An example tool for performing this step can be the Oxford Plasmalab® 80Plus system, the step can be accomplished at a temperature of 350° C. Other tools and temperatures could be used to establish non-uniform cladding 38, depending on the materials selected for layers, 32, 34 and 36. Etching can be accomplished using a mixture of 5% silane ($SiH_4$) and 95% nitrogen ($N_2$) at 117 sccm with 710 sccm of nitrous oxide ($N_2O$) at a deposition rate of 72 nm/minute. The PECVD chamber pressure is 1000 mT and the RF power can be 20 W at 13.56 MHz.

Figure 5:
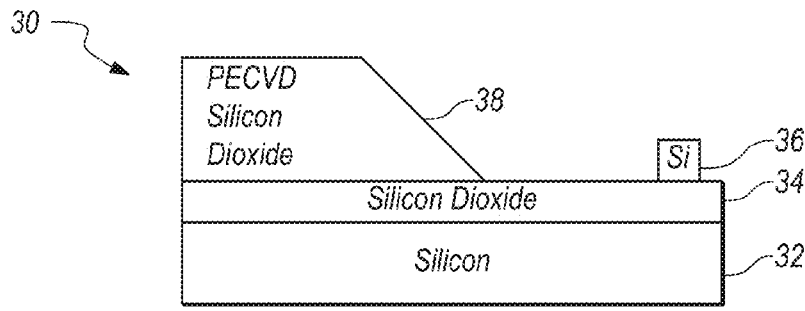
FIG. 5 is the same view as FIG. 2 after the wet-etching step.

Referring next to FIGS. 1, 5 and 6, the methods according to several embodiments can include the step 20 of wet-etching the non-uniform cladding 38 portions of the wafer. To do this, the resulting silicon waveguides can be patterned with Shipley S1805 photoresist, then exposed with a mask aligner (such as an Hybrid Technology Group (HTG) Mask Aligner, for example), and etched in a complementary metal-oxide-semiconductor (CMOS) grade J.T. Baker buffered oxide solution (BOE) consisting of 33.5% ammonium ($NH_4$), 7% hydrogen fluoride (HF), and 59.5% water ($H_2O$), for a duration of 195 seconds. The remaining S1805 photoresist can be removed with Shipley Microposit Remover 1165.

By cross-referencing FIGS. 5 and 6, it can be seen that after step 20 is performed, the placement and arrangement of geometric structures 40 when viewed in top plan (the structure 40 were patterned from patterned silicon layer 36) can cooperate with non-uniform cladding 38 to form ultra-sharp nanoprobes 42. This is because the less dense portions of non-uniform cladding 38 were completely etched (resulting in portions of layer 34 which are visible in FIG. 6), while the denser portions of non-uniform cladding 38 etched slower, which left significant portions of cladding 38 remaining on wafer 30. Adjacent geometric structures 40 can cooperate with the cladding 38 to establish a nanoprobe 42. For example, and referring to FIG. 6, structure 40a (circle) and structure 40b (line) in FIG. 6 cooperate with cladding 38 to establish nanoprobe 42a. It should be appreciated that the methods of the present invention can accomplish the fabrication of a great many nanoprobes 42 (for example, nanoprobes 42b and 42c are also visible in FIG. 6). The number of nanoprobes fabricated is limited only the user's placement, arrangement and selection of geometric structures. As shown in FIGS. 7 and 8, triangles could also be used as well as circles, squares (not shown) or complex polyhedral shapes (FIGS. 11 and 12), and lines to generate the nanoprobe 42, provided the geometric structures are close enough to cause the nanoprobes 42 to emerge from non-uniform cladding 38 once steps 16, 18 and 20 of the methods according to several embodiments are accomplished.

Figure 9:
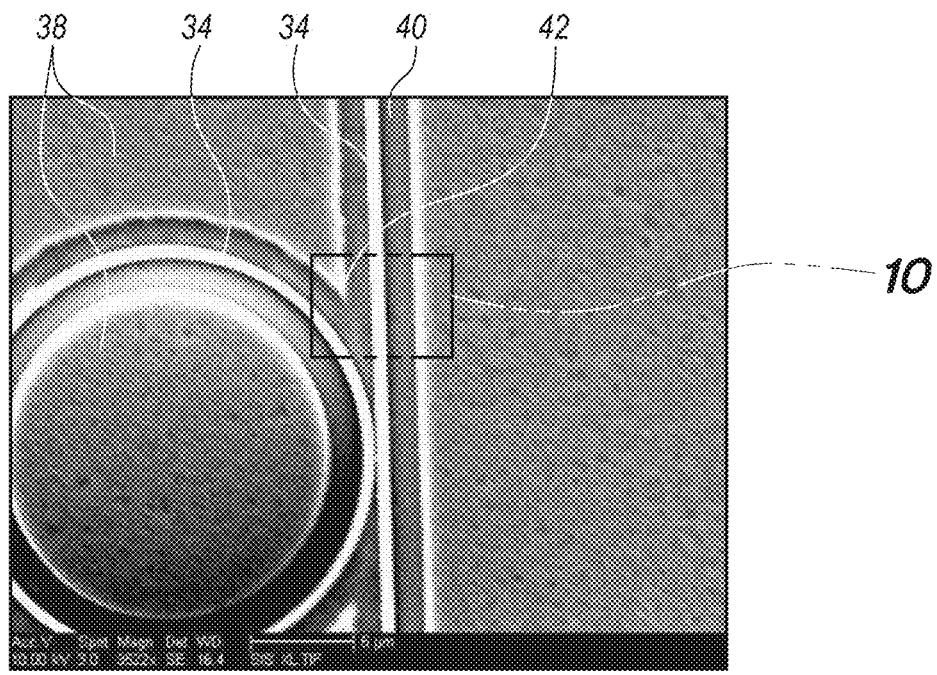
FIG. 9 is a black and white scanning electron microscope (SEM) photograph of the wafer of FIG. 7.
Figure 10:
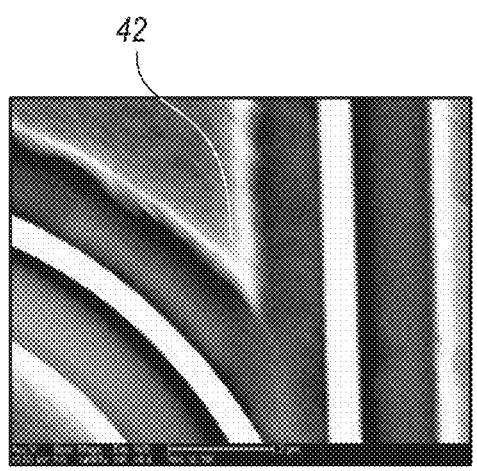
FIG. 10 is a larger scale black-and-white SEM photograph of the nanoprobe portion of the SEM photograph of FIG. 9.

Referring now to FIGS. 9 and 10, the nanoprobes 42 can be seen in greater detail. The nanoprobes 42 can be imaged via a scanning electronic microscope (SEM). FIG. 9 is an SEM photograph wherein visible SiO2 nanoprobes 42 are visible on the sample. FIG. 10 is a close-up of the nanoprobe portion of the SEM photograph of FIG. 9. For the methods of the present invention according to several embodiments, the nanoprobes 42 illustrated in FIG. 7 can have a radius 44 of twenty nanometers (20 nm). With nanoprobes of the shape and size, methods such atomic force microscopy (AFM) can be accomplished more effectively with the device of the present invention. As mentioned above, the size, shape and positioning (via the patterning step) of structures can determine the shape and location of the nanoprobes 42 that are formed, as well as the yield of nanoprobes (the number of nanoprobes 42 for a given surface area of wafer 30) when using the methods of the present invention according to several embodiments.

Figure 11:
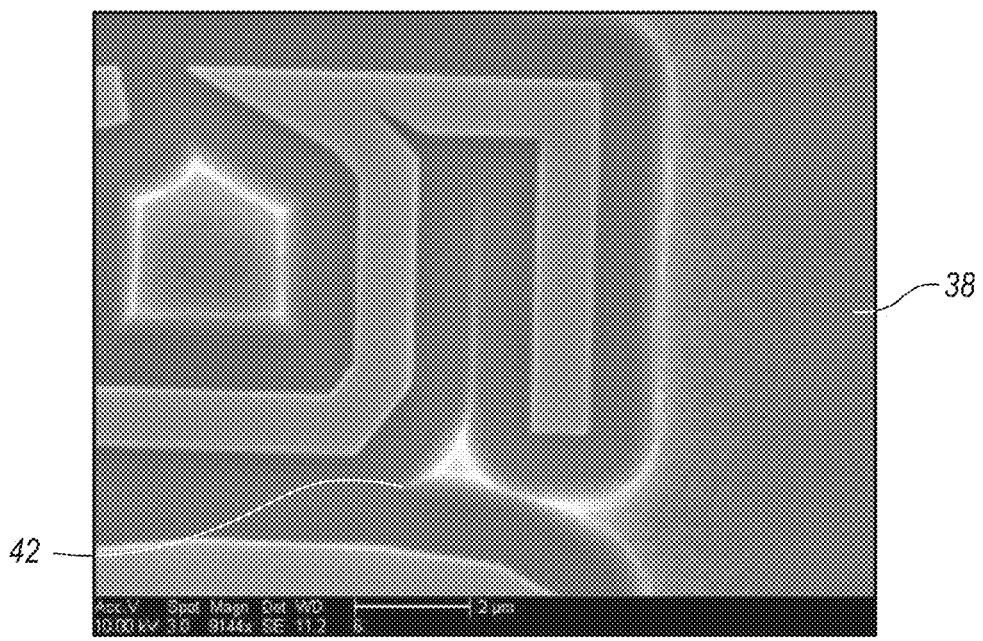
FIG. 11 a black-and-white SEM photograph of an alternative embodiment of the geometric structures and nanoprobe shown in FIG. 9; and, FIG. 12 is a black-and-white SEM photograph of a nanoprobe portion of the photograph of FIG. 11.
Figure 12:
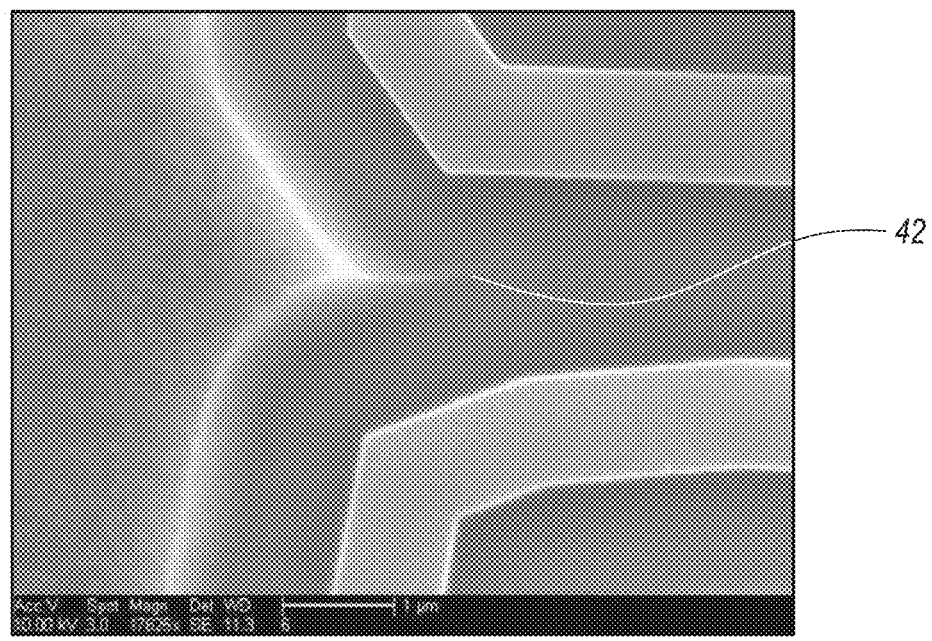

FIGS. 11 and 12 are SEM photographs resulting from the use of alternative geometries for the geometric structures 40 of the present invention. FIGS. 11 and 12 utilized complex polyhedral shapes to perform the ultra-sharp nanoprobes. As shown in FIGS. 11 and 12, the use of different geometries 40 can result in a greater yield of nanoprobes per unite areas of wafer 30, or the use can result in nanoprobes with different radii 44, depending on the applications of the end user.

In several alternative embodiments, a thin layer of metal (not shown in the Figs.) can be deposited on cladding 38 using electron beam evaporation or atomic layer deposition. In other alternative embodiments, a number of alternative materials that may be used in the design of nanoprobes 42. For example, silicon, metals, GaAs, GaN, Sapphire, Germanium, InP, GaP, GaSb, InSb, InAs, CdS, CdTe, ZnO, ZnSe, $LiNbO_3$ and $LiTaO_3$ could be used for layer 36. Other PECVD oxides may also be used, such as $SiO_x$, $SiN_x$, $SiO_xN_y$, Amorphous silicon (a-Si:H), SiC, and Diamond-like carbon (DLC), for example. As mentioned above, there are several ways to pattern the wafer, including but not limited to e-beam lithography and photolithography. The nanoprobes can be combined with microfluidic chambers for biochemical sensing applications. Similarly, the nanoprobes may be combined with materials responsive to electron interactions, such as phosphors or organic compounds for photonic applications.

The use of the terms "a" and "an" and "the" and similar references in the context of describing the invention (especially in the context of the following claims) is to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A method for fabricating a nanoprobe, comprising the sequential steps of:
   A) providing a wafer;
   B) patterning said wafer with a plurality of geometric structures;
   C) dry-etching said wafer;
   D) depositing a non-uniform cladding on said wafer;
   E) wet-etching said wafer from said step D); and,
at least two of said plurality of geometric structures cooperating with said non-uniform cladding to establish said nanoprobes when said step E) is accomplished.

2. The method of claim 1, wherein said step A) is accomplished using a silicon on insulator (SOI) wafer.

3. The method of claim 1, wherein geometric structures have geometric shapes selected from the group consisting of circles and triangles when said wafer is viewed in top plan.

4. The method of claim 3, where said geometric structures are made of materials selected from the group consisting of silicon, metals, GaAs, GaN, Sapphire, Germanium, InP, GaP, GaSb, InSb, InAs, CdS, CdTe, ZnO, ZnSe, LiNbO$_3$ and LiTaO$_3$.

5. The method of claim 3, wherein said step B) is accomplished using electron-beam lithography.

6. The method of claim 3, wherein said step B) is accomplished using photo lithography.

7. The method of claim 1, wherein said step D) is accomplished using plasma enhanced chemical vapor deposition (PECVD).

8. The method of claim 7, wherein said PECVD is accomplished using materials selected from the group consisting of SiO$_x$, SiN$_x$, SiO$_x$N$_y$, Amorphous silicon (a-Si:H), SiC, and Diamond-like carbon (DLC).

9. The method of claim 1, wherein the accomplishment of said method results in a said nanoprobe having a radius of less than 20 nanometers.

10. A method for atomic force microscopy (AFM) comprising the sequential steps of:
    A) providing a wafer;
    B) patterning said wafer with a plurality of geometric structures;
    C) dry-etching said wafer;
    D) depositing a non-uniform cladding on said wafer;
    E) wet-etching said wafer from said step C) to expose said geometric structures; and,
    at least two of said geometric structures cooperating with said non-uniform cladding to establish a nanoprobe for said AFM.

11. The method of claim 10, wherein said step A) is accomplished using a silicon on insulator (SOI) wafer.

12. The method of claim 10, wherein said geometric structures have geometric shapes selected from the group consisting of circles and triangles.

13. The method of claim 12, where said geometric structures are made of materials selected from the group consisting of silicon, metals, GaAs, GaN, Sapphire, Germanium, InP, GaP, GaSb, InSb, InAs, CdS, CdTe, ZnO, ZnSe, LiNbO$_3$ and LiTaO$_3$.

14. The method of claim 12, wherein said step B) is accomplishing using an electron-beam lithography.

15. The method of claim 12, wherein said step B) is accomplished using photo lithography.

16. The method of claim 8, wherein said step D) is accomplished using plasma enhanced chemical vapor deposition (PECVD).

17. The method of claim 16, wherein said PECVD is accomplished using materials selected from the group consisting of SiO$_x$, SiN$_x$, SiO$_x$N$_y$, Amorphous silicon (a-Si:H), SiC, and Diamond-like carbon (DLC).

18. The method of claim 8, wherein the accomplishments of said method results in said nanoprobes with a radius of less than 20 nanometers.

\* \* \* \* \*